United States Patent
Chou et al.

(10) Patent No.: US 12,322,686 B2
(45) Date of Patent: Jun. 3, 2025

(54) REDISTRIBUTION LAYER STRUCTURE

(71) Applicant: Innolux Corporation, Miao-Li County (TW)

(72) Inventors: Hung-Sheng Chou, Miao-Li County (TW); Wen-Hsiang Liao, Miao-Li County (TW); Kuo-Jung Fan, Miao-Li County (TW); Heng-Shen Yeh, Miao-Li County (TW); Cheng-Chi Wang, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 573 days.

(21) Appl. No.: 17/531,777

(22) Filed: Nov. 21, 2021

(65) Prior Publication Data

US 2022/0189863 A1    Jun. 16, 2022

(30) Foreign Application Priority Data

Dec. 15, 2020  (CN) .......................... 202011481917.X
Nov. 15, 2021  (CN) .......................... 202111350591.1

(51) Int. Cl.
  *H01L 23/498*  (2006.01)
  *H01L 21/48*   (2006.01)
  *H01L 21/683*  (2006.01)

(52) U.S. Cl.
  CPC .... *H01L 23/49822* (2013.01); *H01L 21/4857* (2013.01); *H01L 21/6835* (2013.01); *H01L 2221/68345* (2013.01)

(58) Field of Classification Search
  None
  See application file for complete search history.

(56) References Cited

U.S. PATENT DOCUMENTS

| | | | |
|---|---|---|---|
| 2014/0252647 A1* | 9/2014 | Huang | H01L 24/11 257/774 |
| 2015/0270247 A1* | 9/2015 | Chen | H01L 25/105 257/737 |
| 2016/0118333 A1* | 4/2016 | Lin | H01L 21/6836 257/773 |
| 2018/0082962 A1 | 3/2018 | Lee et al. | |
| 2019/0157121 A1* | 5/2019 | Liao | C08G 73/105 |
| 2020/0027804 A1* | 1/2020 | Fang | H01L 24/11 |
| 2020/0098694 A1 | 3/2020 | Suk et al. | |
| 2020/0273723 A1 | 8/2020 | Lee et al. | |
| 2021/0098382 A1* | 4/2021 | Lin | H01L 21/4857 |
| 2022/0189862 A1* | 6/2022 | Chou | H01L 23/52 |

\* cited by examiner

*Primary Examiner* — Cory W Eskridge
(74) *Attorney, Agent, or Firm* — JCIPRNET

(57) ABSTRACT

A redistribution layer structure is provided. The redistribution layer structure includes a first metal layer, a first dielectric layer disposed on the first metal layer, a second metal layer disposed on the first dielectric layer, and a second dielectric layer disposed on the second metal layer. A coefficient of thermal expansion of the first dielectric layer is less than a coefficient of thermal expansion of the second dielectric layer.

11 Claims, 2 Drawing Sheets

REDISTRIBUTION LAYER STRUCTURE

CROSS-REFERENCE TO RELATED APPLICATION

This application claims the priority benefit of China application serial no. 202011481917.X, filed on Dec. 15, 2020, and China application serial no. 202111350591.1, filed on Nov. 15, 2021. The entirety of the above-mentioned patent application is hereby incorporated by reference herein and made a part of this specification.

BACKGROUND

Technical Field

The disclosure relates to a circuit structure of an electronic device, and in particular to a redistribution layer structure.

Description of Related Art

With continuous increase in the application of electronic components, new progress is seen in the development of display technology every day. With different manufacturing process conditions, higher and higher requirements are seen in the structure and quality of the electronic component, thereby causing the electronic components to face different issues. Therefore, there has to be constant renewal and modifications in the research and development of the electronic components.

SUMMARY

The disclosure provides a redistribution layer structure, which has good structural strength or quality.

According to an embodiment of the disclosure, the redistribution layer structure includes a first metal layer, a first dielectric layer, a second metal layer, and a second dielectric layer. The first dielectric layer is disposed on the first metal layer. The second metal layer is disposed on the first dielectric layer. The second dielectric layer is disposed on the second metal layer. A coefficient of thermal expansion of the first dielectric layer is less than a coefficient of thermal expansion of the second dielectric layer.

According to an embodiment of the disclosure, the manufacturing method of the redistribution layer structure includes the following steps. A substrate is provided. A first metal layer is formed on the substrate. A first dielectric layer is formed on the first metal layer. A second metal layer is formed on the first dielectric layer. A second dielectric layer is formed on the second metal layer. A coefficient of thermal expansion of the first dielectric layer is less than a coefficient of thermal expansion of the second dielectric layer.

In summary, in the redistribution layer structure according to the embodiment of the disclosure, the coefficient of thermal expansion of the first dielectric layer is less than the coefficient of thermal expansion of the second dielectric layer. In this way, the first dielectric layer with lower coefficient of thermal expansion can be matched with the substrate with lower coefficient of thermal expansion. Therefore, the deformation difference caused by the rising and falling temperatures during the manufacturing process may be reduced. Thereby, the probability of warpage in the redistribution layer structure may be reduced. The redistribution layer structure can have good structural strength or quality. In addition, the coefficients of thermal expansion of each of the multiple dielectric layers in the redistribution layer structure can be arranged to gradually increase in an order of bottom to top, which can reduce the deformation difference between different dielectric layers. An impact of residual stress may be reduced. In addition, the redistribution layer structure can achieve good manufacturing process yield or quality during the manufacturing process.

To make the aforementioned more comprehensible, several embodiments accompanied with drawings are described in detail as follows.

DESCRIPTION OF THE EMBODIMENTS

Figure 1:
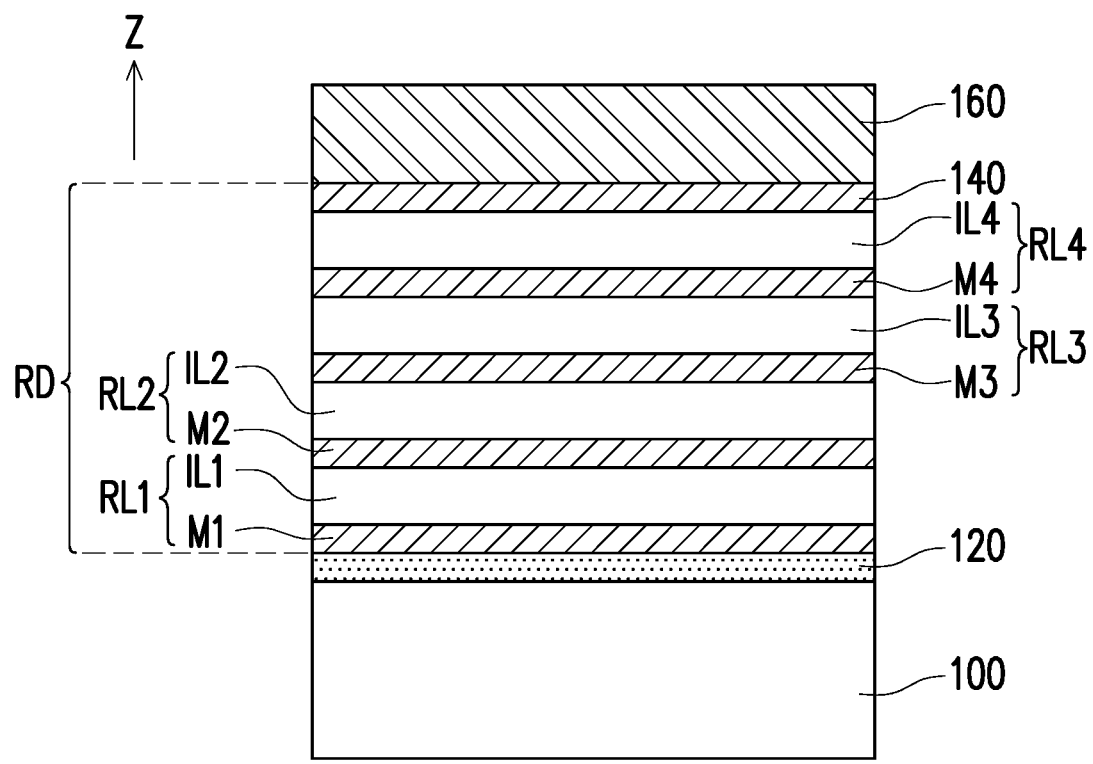
FIG. 1 is a schematic cross-sectional view of a redistribution layer structure according to an embodiment of the disclosure.

The disclosure may be understood with reference to detailed description in conjunction with accompanying drawings as follows. It should be noted that, for ease of understanding by a reader and for clarity of the drawings, only a part of the electronic component is illustrated in the multiple drawings of this disclosure, and specific elements in the drawings are not drawn according to actual scale. In addition, the number and size of each element in the drawing are only for illustrative purpose, and are not meant to limit the scope of the disclosure.

Certain words are used throughout the specification and the appended claims to refer to specific elements. Those skilled in the art should understand that electronic component manufacturers may refer to the same elements by different names. This text does not intend to distinguish those elements with the same function but different names. In the following descriptions and claims, words such as "including", "containing", and "having" are open-ended words, thus, they should be interpreted as "containing, but not limited to . . . ". Therefore, when the terms "including", "containing", and/or "having" are used in the descriptions of the disclosure, they specify the existence of corresponding features, regions, steps, operations and/or components, but do not exclude the existence of one or more corresponding features, regions, steps, operations, and/or components.

Directional terms mentioned in this text, such as "upper", "lower", "front", "back", "left", or "right", are only directions with reference to the drawings. Therefore, the directional terms used are for illustration, and are not meant to limit this disclosure. Each of the drawings shows the general features of the methods, structures, and/or materials used in a specific embodiment. However, these drawings should not be construed as defining or limiting the scope or nature covered by these embodiments. For example, for the sake of clarity, the relative size, thickness, and position of each film layer, region, and/or structure may be reduced or enlarged.

In this disclosure, the length and width may be measured by using an optical microscope, and the thickness may be obtained by measuring the cross-sectional image in an electron microscope, but the disclosure is not limited thereto.

Terms such as "approximately", "equal to", "equivalent", "same", "substantially", or "roughly" are generally interpreted as being within 20% of a given value, or interpreted as being within a range of 10%, 5%, 3%, 2%, 1%, or 0.5% of a given value.

When a structure (layer, component, or substrate) described in the disclosure is located on/above another structure (layer, component, or substrate), it may indicate that the two structures are adjacent and directly connected, or it may also indicate that the two structures are adjacent and indirectly connected. Being indirectly connected indicates that there is at least one intermediary structure (intermediary layer, intermediary component, intermediary substrate, or intermediary spacing) between the two structures, in which a bottom surface of one structure is adjacent or directly connected to a top surface of the intermediary structure, and a top surface of the other structure is adjacent or directly connected to a bottom surface of the intermediary structure, and the intermediary structure may include a single-layer or a multi-layer physical structure or non-physical structure, without any limitation. In the disclosure, when a structure is disposed "on" another structure, it may indicate that the structure is "directly" on the other structure, or that the structure is "indirectly" on the other structure. That is, at least one structure is sandwiched between the structure and the other structure.

Terms such as "first", and "second" in the specification of the disclosure may be used herein to describe various elements, components, regions, layers and/or parts, but these elements, components, regions, and/or parts should not be restricted by these terms. These terms are only used to distinguish one element, component, region, layer, or part from another element, component, region, layer, or part. Therefore, a "first element", "component", "region", "layer", or "part" discussed below is used to distinguish from a "second element", "component", "region", "layer", or "part", and are not meant to limit an order or specific elements, components, regions, layers, and/or parts. Moreover, the "first" element referred to in the descriptions of the specification may be renamed as the "second" element in the claims.

An electronic component may have a redistribution layer structure according to an embodiment of the disclosure. For example, the electronic component may be a semiconductor package type electronic component, such as a system on chip (SoC), a system in package (SiP), or other electronic components manufactured through the manufacturing method of the disclosure. The electronic component may be used in an electronic device such as a display device, an antenna device, a sensing device, a splicing device, or a transparent display device, but is not limited thereto. The electronic component may be a rollable, stretchable, bendable, or flexible electronic component. The electronic component may, for example, include liquid crystal, light-emitting diode (LED), quantum dot (QD), fluorescence, phosphor, or other suitable materials, and the materials may be arbitrarily arranged and combined, or other suitable display media, or a combination of the foregoing. The light-emitting diode may include, for example, an organic light-emitting diode (OLED), a millimeter/sub-millimeter light-emitting diode (mini LED), a micro light-emitting diode (micro LED), or a quantum dot (QD) light-emitting diode (such as a QLED, a QDLED), but is not limited thereto. The antenna device may be, for example, a liquid crystal antenna, but is not limited thereto. The splicing device may be, for example, a display splicing device or an antenna splicing device, but is not limited thereto. It should be noted that the electronic component may be any combination of the foregoing, but is not limited to this. In addition, the appearance of the electronic component may be rectangular, circular, polygonal, a shape with curved edges, or other suitable shapes. The electronic component may have a peripheral system such as a driving system, a control system, a light source system, or a shelf system to support the display device, the antenna device, or the splicing device. Hereinafter, the redistribution structure is used to describe the content of the disclosure, but the disclosure is not limited thereto.

In the disclosure, various embodiments described below may be mixed and matched without departing from the spirit and scope of the disclosure. For example, some features of an embodiment may be combined with some features of another embodiment to form another embodiment.

Reference will now be made in detail to the exemplary embodiments of the disclosure, and examples of the exemplary embodiments are illustrated in the accompanying drawings.

Whenever possible, the same reference numerals are used in the drawings and the description to indicate the same or similar parts.

FIG. 1 is a schematic cross-sectional view of a redistribution layer structure according to an embodiment of the disclosure. For clarity of the drawings and convenience of description, several components are omitted in FIG. 1. Referring to FIG. 1, a redistribution layer structure RD disposed on the substrate 100 is, for example, a redistribution circuit for achieving a high-density integrated circuit (IC), but not limited thereto. The redistribution layer structure RD may include multiple conductive layers and multiple dielectric layers alternately stacked in a normal direction (for example, a Z-axis direction in FIG. 1) of the substrate 100.

FIG. 1 shows a portion of the redistribution layer structure RD. The redistribution layer structure RD includes a stack of multiple redistribution layers. Each redistribution layer includes, for example, a stack of a metal layer and a dielectric layer, but not limited thereto. In some embodiments, the redistribution layer structure RD is, for example, a stack of four redistribution layers RL1, RL2, RL3, and RL4, but not limited thereto.

In some embodiments, the redistribution layer structure RD includes at least a first metal layer M1, a first dielectric layer ILL a second metal layer M2, and a second dielectric layer IL2. In some embodiments, the redistribution layer structure RD further includes a third metal layer M3, a third dielectric layer IL3, a fourth metal layer M4, and a fourth dielectric layer IL4. In the embodiment, the first dielectric layer IL1 is disposed on the first metal layer M1. The second metal layer M2 is disposed on the first dielectric layer ILL The second dielectric layer IL2 is disposed on the second metal layer M2. The third metal layer M3 is disposed on the second dielectric layer IL2. The third dielectric layer IL3 is disposed on the third metal layer M3. The fourth metal layer M4 is disposed on the third dielectric layer IL3. The fourth dielectric layer IL4 is disposed on the fourth metal layer M4. It should be noted that, in the disclosure, the metal layers M1, M2, M3, and M4 may respectively be circuit layers formed by patterning, but not limited thereto. In order to make the drawings clear, FIG. 1 schematically shows the four redistribution layers RL1, RL2, RL3, RL4 including four metal layers and four dielectric layers, but the number of film layers shown in FIG. 1 is not intended to limit the disclosure. In other embodiments, the number of the metal layers and the dielectric layers may be more or less, depending on actual design requirements. In addition, the disclosure does not limit the layout of the redistribution layer structure RD. In the embodiment, since a coefficient of thermal expansion (CTE) of the first dielectric layer IL1 of the redistribution layer structure RD is less than a coefficient of thermal expansion of the second dielectric layer IL2, the coefficient of thermal expansion of the first dielectric layer IL1 located at the bottom near the substrate 100 is similar to a coefficient of thermal expansion of the substrate 100. The deformation difference caused by the rising and falling temperatures during the manufacturing process may be reduced. In this way, the probability of warpage occurring in the redistribution layer structure RD can be reduced. The redistribution layer structure RD can have good structural strength or quality. In addition, in the manufacturing process, the redistribution layer structure RD can achieve good manufacturing process yield or quality. A material and a structural relationship of each film layer are briefly described as follows.

Referring to FIG. 1, the redistribution layer structure RD of the embodiment may be disposed on the substrate 100 during the manufacturing process, and the substrate 100 is removed after the manufacturing process is completed. A material of the substrate 100 includes organic or inorganic materials, such as glass, quartz, sapphire or ceramic, silicon wafer, stainless steel, ceramic, molding compound (such as polycarbonate (PC), polyimide (PI), polyethylene terephthalate (PET), resin, epoxy resin, organic silicon compound), other suitable substrate materials, or a combination of the above-mentioned materials, but not limited thereto. For example, a coefficient of thermal expansion of glass ranges from 3 ppm/° C. to 16 ppm/° C. (i.e. 3 ppm/° C.≤ the coefficient of thermal expansion≤16 ppm/° C.). In some embodiments, the substrate 100 may include a wafer. It should be noted that the package structure may be formed by a RDL-first manufacturing method or a chip-first manufacturing method. In the RDL-first manufacturing method, the redistribution layer is formed before the chip molding process. In the chip-first manufacturing method, the chip molding process is performed before the formation of the redistribution layer. The RDL-first manufacturing method is exemplarily used in the present disclosure. Since the substrate 100 is used to carry a redistribution layer which will be described in the following paragraphs. In the chip-first process, a chip molding process is performed to make a substrate 100 including at least one chip and an encapsulation material, and then the redistribution layer is formed on the substrate 100.

In some embodiments, a debonding layer 120 may be selectively provided on the substrate 100. That is, the debonding layer 120 may be disposed between the substrate 100 and the redistribution layer structure RD. The debonding layer 120 is, for example, a photo-curable release film or a thermal curable release film, but not limited thereto. A viscosity of the photo-curable release film is reduced through a photo-curing process. A viscosity of the thermal cured release film is reduced through a thermal-curing process. In other embodiments, the debonding layer 120 may also be a laser release film. The thickness of the debonding layer 120 may be 0.5 μm to 1.5 μm (i.e. 0.5 μm≤the thickness≤1.5 μm), but not limited thereto.

In the embodiment, the first redistribution layer RL1 of the redistribution layer structure RD is disposed on the substrate 100. For example, the first metal layer M1 is disposed on the debonding layer 120. A material of the first metal layer M1 may include molybdenum (Mo), tantalum (Ta), niobium (Nb), hafnium (HO, nickel (Ni), chromium (Cr), Cobalt (Co), zirconium (Zr), tungsten (W), aluminum (Al), titanium (Ti), copper (Cu), other suitable metals, or an alloy or a combination of the above-mentioned materials. In some embodiments, the first metal layer M1 is, for example, a single-layer metal layer or a stacked-layer structure having multiple stacked sub-metal layers. For example, the first metal layer M1 may be a copper layer with a single-layer structure. Alternatively, the first metal layer M1 may include at least two stacked sub-metal layer. For example, one of the two sub-metal layers may include titanium, and the other of the two sub-metal layers may include copper. Therefore, the first metal layer M1 may be a multi-layer structure of titanium-copper, but not limited thereto.

The first dielectric layer IL1 is disposed on the first metal layer M1. A material of the first dielectric layer IL1 may include photosensitive polyimide, photosensitive polybenzoxazole (photosensitive PBO), benzocyclobutene (BCB), polyaromatic fluorocarbon, photosensitive polyphenylene ether (photosensitive PPE) or other suitable materials, but not limited thereto.

In some embodiments, the first dielectric layer IL1 and the first metal layer M1 can form the first redistribution layer RL1. A thickness of the first dielectric layer IL1 may be defined as a maximum distance from a top surface to a bottom surface of the first dielectric layer IL1 in the normal direction (for example, the Z axis direction shown in FIG. 1) of the substrate 100. The thickness of the first dielectric layer IL1 is, for example, 5 micrometers (μm) to 20 micrometers (μm) (i.e. 5 μm≤the thickness≤20 μm), but not limited thereto. In other embodiments, the thickness of the first dielectric layer IL1 may be 11 μm to 19 μm (i.e. 11 μm≤the thickness≤19 μm). A Young's Modulus of the first dielectric layer IL1 ranges from 3 GPa (gigapascal) to 5 GPa (i.e. 3 GPa≤the Young's Modulus≤5 GPa), but not limited thereto. The coefficient of thermal expansion of the first dielectric layer IL1 is 20 ppm/° C., but not limited thereto. In other embodiments, the coefficient of thermal expansion of the first dielectric layer IL1 may be 20 ppm/° C. to 40 ppm/° C. (i.e. 20 ppm/° C.≤coefficient of thermal expansion≤40 ppm/° C.).

In some embodiments, the thickness of the first metal layer M1 may be defined as a maximum distance from a top surface to a bottom surface of the first metal layer M1 in the normal direction of the substrate 100. A thickness of the first metal layer M1 is, for example, 4 μm to 13 μm (i.e. 4 μm≤the thickness≤13 μm), but not limited thereto. A Young's modulus of the first metal layer M1 is 90 GPa to 120 GPa (i.e. 90 GPa≤the Young's modulus≤120 GPa), but not limited thereto. The coefficient of thermal expansion of the first metal layer M1 is 18 ppm/° C., but not limited to this. In other embodiments, the coefficient of thermal expansion of the first metal layer M1 may be 16 ppm/° C. to 20 ppm/° C. (i.e. 16 ppm/° C.≤coefficient of thermal expansion≤20 ppm/° C.). It should be noted that when the first metal layer M1 is a stack of multiple sub-metal layers, the coefficient of thermal expansion of the first metal layer M1 is adjusted by factors such as material characteristics of each sub-metal layer and thickness of each sub-metal layer. At this time, the coefficient of thermal expansion value of the first metal layer M1 may be obtained through calculation or actual measurement.

In the embodiment, the second redistribution layer RL2 of the redistribution layer structure RD is disposed on the first redistribution layer RL1. For example, the second metal layer M2 is disposed on the first dielectric layer ILL A material of the second metal layer M2 may be the same as or different from the material of the first metal layer M1, for example. including molybdenum, tantalum, niobium, hafnium, nickel, chromium, cobalt, zirconium, tungsten, aluminum, titanium, copper, other suitable metals, or an alloy or a combination of the above-mentioned materials. In some embodiments, the second metal layer M2 may be similar to the first metal layer M1, such that the second metal layer M2 may be, for example, a single-layer metal layer or a stacked-layer structure having multiple stacked sub-metal layers. For example, the second metal layer M2 may be a copper layer with a single-layer structure. Alternatively, the second metal layer M2 may include at least two stacked sub-metal layers, in which one of the two sub-metal layers includes titanium, and the other of the two sub-metal layers includes copper. Therefore, the second metal layer M2 may be a multi-layer structure of titanium-copper, but not limited thereto.

In the embodiment, the first metal layer M1 and the second metal layer M2 are separated by the first dielectric layer ILL but not limited thereto.

In other embodiments, multiple conductive via holes (not shown) may be disposed between the first metal layer M1 and the second metal layer M2. The first metal layer M1 and the second metal layer M2 are electrically connected to each other through at least some of the conductive vias. In other words, the first metal layer M1 and the second metal layer M2 may be interconnected circuits in the redistribution layer structure RD.

The second dielectric layer IL2 is disposed on the second metal layer M2. Similar to the first dielectric layer IL2, a material of the second dielectric layer IL2 may include photosensitive polyimide, photosensitive polybenzoxazole (photosensitive PBO), benzocyclobutene (BCB), polyaromatic flurocarbons, photosensitive polyphenylene ether (photosensitive PPE) or other suitable materials, but not limited thereto.

A thickness of the second dielectric layer IL2 may be defined as a maximum distance from a top surface to a bottom surface of the second dielectric layer IL2 in the normal direction (the Z axis direction in FIG. 1) of the substrate 100. The thickness of the second dielectric layer IL2 is, for example, 5 μm to 20 μm (i.e. 5 μm≤the thickness≤20 μm), but not limited thereto. In other embodiments, the thickness of the second dielectric layer IL2 may be 9 μm to 11 μm (i.e. 9 μm≤the thickness 11 μm). In some embodiments, the thickness of the first dielectric layer IL1 and the second dielectric layer IL2 may be the same or different. As shown in FIG. 1, the thickness of the first dielectric layer IL1 and the second dielectric layer IL2 may be, for example, substantially the same.

A Young's modulus of the second dielectric layer IL2 is 3 GPa to 5GPa (i.e. 3 GPa≤the Young's modulus≤5 GPa), but not limited thereto. A coefficient of thermal expansion of the second dielectric layer IL2 is 30 ppm/° C., but not limited thereto. In other embodiments, the coefficient of thermal expansion of the second dielectric layer IL2 may be 20 ppm/° C. to 40 ppm/° C. (i.e. 20 ppm/° C.≤the coefficient of thermal expansion≤40 ppm/° C.).

In some embodiments, a thickness of the second metal layer M2 may be defined as a maximum distance between a top surface and a bottom surface of the second metal layer M2 in the normal direction (the Z axis direction in FIG. 1) of the substrate 100. The thickness of the second metal layer M2 is, for example, 4 μm to 13 μm (i.e. 4 μm≤the thickness 13 μm), but not limited thereto. A Young's modulus of the second metal layer M2 is 90 GPa to 120 GPa (i.e. 90 GPa≤the Young's modulus≤120 GPa), but not limited thereto. A coefficient of thermal expansion of the second metal layer M2 is 18 ppm/° C., but not limited thereto. In other embodiments, the coefficient of thermal expansion of the second metal layer M2 may be 16 ppm/° C. to 20 ppm/° C. (i.e. 16 ppm/° C.≤the coefficient of thermal expansion≤20 ppm/° C.).

It should be noted that, since the coefficient of thermal expansion of the first dielectric layer IL1 is less than the coefficient of thermal expansion of the second dielectric layer IL2, the coefficient of thermal expansion of the first dielectric layer ILL which is near the substrate 100, may be closer to the coefficient of thermal expansion of the substrate 100 (for example, 3 ppm/° C. to 16 ppm/° C.). As a result, the coefficient of thermal expansion of the first dielectric layer IL1 is closer to the coefficient of thermal expansion of the substrate 100. The deformation difference caused by the rising and falling temperatures during the manufacturing process may be reduced. In this way, the redistribution layer structure RD can reduce the probability of warpage occurring. The redistribution layer structure RD can have good structural strength or quality. In addition, the deformation difference between the first dielectric layer IL1 and the second dielectric layer IL2 can be reduced, and the influence of residual stress can be reduced. The structural reliability of redistribution layer structure RD can be improved. In addition, the redistribution layer structure RD can achieve a good manufacturing process yield or quality.

In addition to including to including the first redistribution layer RL1 and the second redistribution layer RL2, the redistribution layer structure RD may also sequentially include stacked layers of the third redistribution layer RL3 and the fourth redistribution layer RL4, but the disclosure is not limited to the number of redistribution layers shown above.

In some embodiments, the third dielectric layer IL3 and the third metal layer M3 can form the third redistribution layer RL3. A thickness of the third dielectric layer IL3 may be defined as a maximum distance from a top surface to a bottom surface of the third dielectric layer IL3 in the normal direction (the Z axis direction in FIG. 1) of the substrate 100. The thickness of the third dielectric layer IL3 is, for example, 5 μm to 20 μm (i.e. 5 μm≤the thickness≤20 μm), but not limited thereto. In other embodiments, the thickness of the third dielectric layer IL3 may be 7 μm to 9 μm (i.e. 7 μm≤the thickness≤9 μm). In some embodiments, the thickness of the first dielectric layer IL1 and the thickness of the third dielectric layer IL3 may be the same or different. As shown in FIG. 1, the thickness of the first dielectric layer IL1 and the thickness of the third dielectric layer IL3 are, for example, substantially the same.

A Young's modulus of the third dielectric layer IL3 is 1 GPa to 3 GPa (i.e. 1 GPa≤the Young's modulus≤3 GPa), but not limited thereto. A coefficient of thermal expansion of the third dielectric layer IL3 is 40 ppm/° C., but not limited thereto. In other embodiments, the coefficient of thermal expansion of the third dielectric layer IL3 may be 40 ppm/° C. to 80 ppm/° C. (i.e. 40 ppm/° C.≤the coefficient of thermal expansion≤80 ppm/° C.).

In some embodiments, a thickness of the third metal layer M3 may be defined as a maximum distance from a top surface to a bottom surface of the third metal layer M3 in the normal direction (the Z axis direction in FIG. 1) of the substrate 100. The thickness of the third metal layer M3 is, for example, 4 μm to 13 μm (i.e. 4 μm≤thickness≤13 μm), but not limited thereto. A Young's modulus of the third metal layer M3 is 90 GPa to 120 GPa (i.e. 90 GPa≤the Young's modulus≤120 GPa), but not limited thereto. A coefficient of thermal expansion of the third metal layer M3 is 18 ppm/° C., but not limited thereto. In other embodiments, the coefficient of thermal expansion of the third metal layer M3 may be 16 ppm/° C. to 20 ppm/° C. (i.e. 16 ppm/° C.≤the coefficient of thermal expansion≤20 ppm/° C.).

In some embodiments, the fourth dielectric layer IL4 and the fourth metal layer M4 can form the fourth redistribution layer RL4. A thickness of the fourth dielectric layer IL4 may be defined as a maximum distance from a top surface to a bottom surface of the fourth dielectric layer IL4 in the normal direction (the Z axis direction in FIG. 1) of the substrate 100. The thickness of the fourth dielectric layer IL4 is, for example, 5 µm to 20 µm (i.e. 5 µm≤thickness 20 µm), but not limited thereto. In other embodiments, the thickness of the fourth dielectric layer IL4 may be 5 µm to 9 µm (i.e. 5 µm≤thickness≤9 µm). In some embodiments, the thickness of the first dielectric layer IL1 and the thickness of the fourth dielectric layer IL4 may be the same or different. As shown in FIG. 1, the thickness of the first dielectric layer IL1 and the thickness of the fourth dielectric layer IL4 may be, for example, substantially the same.

A Young's modulus of the fourth dielectric layer IL4 is 1 GPa to 3 GPa (i.e. 1 GPa≤the Young's modulus≤3 GPa), but not limited thereto. The coefficient of thermal expansion of the fourth dielectric layer IL4 is 50 ppm/° C., but not limited thereto. In other embodiments, the coefficient of thermal expansion of the fourth dielectric layer IL4 may be 40 ppm/° C. to 80 ppm/° C. (i.e. 40 ppm/° C.≤the coefficient of thermal expansion≤80 ppm/° C.).

In some embodiments, a thickness of the fourth metal layer M4 may be defined as a maximum distance from a top surface to a bottom surface of the fourth metal layer M4 in the normal direction (the Z axis direction in FIG. 1) of the substrate 100. A thickness of the fourth metal layer M4 is, for example, 4 µm to 13 µm (i.e. 4 µm≤the thickness≤13 µm), but not limited thereto. A Young's modulus of the fourth metal layer M4 is 90 GPa to 120 GPa (i.e. 90 GPa≤the Young's modulus≤120 GPa), but not limited thereto. A coefficient of thermal expansion of the fourth metal layer M4 is 18 ppm/° C., but not limited thereto. In other embodiments, the coefficient of thermal expansion of the fourth metal layer M4 may be 16 ppm/° C. to 20 ppm/° C. (i.e. 16 ppm/° C.≤the coefficient of thermal expansion≤20 ppm/° C.).

In other embodiments, multiple conductive vias may be respectively disposed between the second metal layer M2 and the third metal layer M3, and between the third metal layer M3 and the fourth metal layer M4. The second metal layer M2 and the third metal layer M3 may be respectively electrically connected to each other through at least some of the conductive vias. The third metal layer M3 and the fourth metal layer M4 may also be respectively electrically connected to each other through at least some of the conductive vias. In other words, the first metal layer M1, the second metal layer M2, the third metal layer M3, and the fourth metal layer M4 may respectively be interconnected circuits in the redistribution layer structure RD.

It is worth noting that, in the redistribution layer structure RD, the coefficient of thermal expansion of the first dielectric layer IL1 is less than the coefficients of thermal expansion of the respective other dielectric layers IL2, IL3, and IL4. In this way, the first dielectric layer IL1 having a low coefficient of thermal expansion can match the substrate 100 having a low coefficient of thermal expansion, thereby reducing the probability of warpage occurring. The redistribution layer structure RD can have good structural strength or quality. In addition, the coefficients of thermal expansion of the respective dielectric layers are arranged to gradually increase in an order of bottom to top, which can reduce the deformation difference between different dielectric layers.

An impact of the residual stress may be reduced. In addition, the redistribution layer structure RD can achieve a good manufacturing process yield or quality. In addition, the upper dielectric layer, which are subjected to less amount of repeated heating and cooling manufacturing processes, can be composed of dielectric materials with higher coefficient of thermal expansion, so as to limit the manufacturing cost.

In other embodiments, the coefficient of thermal expansion of the first dielectric layer IL1 in the redistribution layer structure RD is less than the coefficient of thermal expansion of the second dielectric layer IL2, and the coefficients of thermal expansion of the second dielectric layer IL2, the third dielectric layer IL3, and the fourth dielectric layer IL4 are respectively substantially the same. Under the above configurations, the redistribution layer structure RD may achieve the above-mentioned technical effects.

The redistribution layer structure RD further includes a top connector 140 disposed on an uppermost dielectric layer (for example, the fourth dielectric layer IL4 in the embodiment) of the redistribution layer structure RD and electrically connected to a metal layer (for example, the fourth metal layer M4 in the embodiment) corresponding to the uppermost dielectric layer. The top connector 140 may be, for example, the uppermost pad of the redistribution layer structure RD, but not limited thereto. The top connector 140 is, for example, a single-layer metal layer or a stacked-layer structure having multiple stacked sub-metal layers. For example, the top connector 140 may be a copper layer with a single-layer structure. Alternatively, the top connector 140 may include a stack of sub-metal layer. For example, the top connecting member 140 may be a multi-layer structure of titanium-copper, but not limited thereto.

In some embodiments, an electronic component 160 and an encapsulation material layer (not shown in the figure) may also be disposed above the redistribution layer structure RD to form a package structure. The electronic component 160 is disposed on the fourth dielectric layer IL4 and/or on the top connector 140. The electronic component 160 is, for example, a chip, a die, a diode, a transistor, an integrated circuit (IC), or a combination of the above-mentioned components, or other suitable electronic components. but not limited thereto. The electronic component 160 may be electrically connected to the fourth metal layer M4 through the top connector 140, but not limited thereto. In some embodiments, since the metal layers are electrically connected to each other, the electronic component 160 may be electrically connected to the first metal layer M1 through the top connector 140.

In some embodiments, the encapsulation material layer is disposed on the fourth dielectric layer IL4 or on the top connector 140. The encapsulation material layer may encapsulate the electronic component 160 to embed the electronic component 160 in the encapsulation material layer. A material of the encapsulation material layer is, for example, epoxy, or other suitable materials, and is not limited thereto.

In other embodiments, taking the redistribution layer structure RD which includes the two-layer redistribution layer of the first redistribution layer RL1 and the second redistribution layer RL2 as an example, the top connector 140 may be disposed on the second dielectric layer IL2 of the second redistribution layer RL2. The top connector 140 may be electrically connected to the second metal layer M2, so as to be electrically connected to the first metal layer M1 of the first redistribution layer RL1, but not limited thereto.

In short, in the redistribution layer structure RD, the coefficient of thermal expansion of the first dielectric layer IL1 is less than the coefficient of thermal expansion of the second dielectric layer IL2, and the coefficient of thermal expansion of the second dielectric layer IL2 is less than or equal to the coefficient of thermal expansion of the third dielectric layer IL3. Moreover, the coefficient of thermal expansion of the third dielectric layer IL3 is less than or equal to the coefficient of thermal expansion of the fourth dielectric layer IL4. In this way, the first dielectric layer IL1 having a lower coefficient of thermal expansion can match the substrate 100 having a lower coefficient of thermal expansion. Thereby, the probability of warpage occurring is reduced. The redistribution layer structure RD can have good structural strength or quality. Furthermore, in some embodiments, the coefficients of thermal expansion of the multiple respective dielectric layer in the redistribution layer structure RD are arranged to gradually increase in an order from bottom to top, so that the deformation difference between the different dielectric layers can be reduced. An impact of the residual stress is reduced. In addition, in terms of the manufacturing process, the redistribution layer structure RD can achieve a good manufacturing process yield or quality. Furthermore, the upper dielectric layer, which is subjected to less amount of repeated heating and cooling manufacturing processes, can be composed of the dielectric material having higher coefficient of thermal expansion, so as to limit the manufacturing cost.

Other embodiments are listed below as an illustration of the manufacturing process. It must be noted here that the following embodiments continue to use the reference numerals and a portion of the content of the foregoing embodiments. The same reference numerals are used to represent the same or similar elements, and the description of the same technical content is omitted. Reference may be made to the foregoing embodiments for the description of the omitted parts, which are not repeated in the following embodiments.

Figure 2:
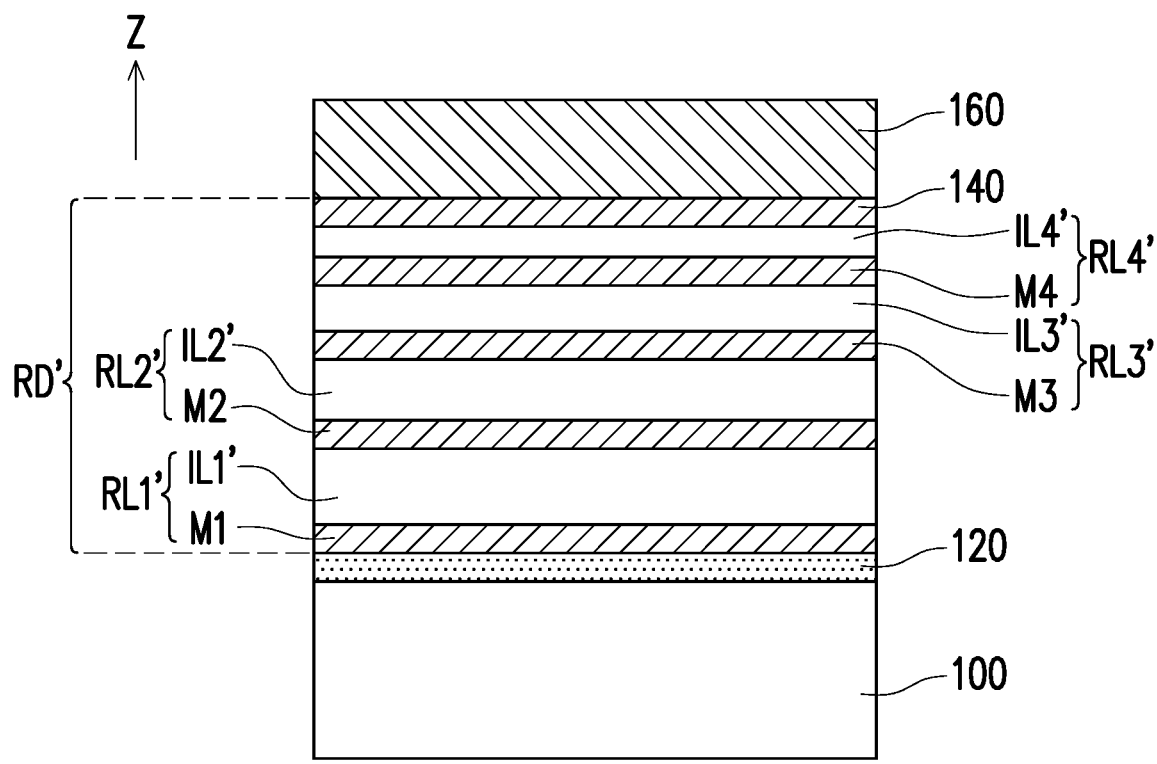
FIG. 2 is a schematic cross-sectional view of a redistribution layer structure according to another embodiment of the disclosure.

FIG. 2 is a schematic cross-sectional view of a redistribution layer structure according to another embodiment of the disclosure. A redistribution layer structure RD' of the embodiment is roughly similar to the redistribution layer structure RD in FIG. 1, so the same and similar components in the two embodiments will not be repeated herein. A main difference between the embodiment shown in FIG. 2 and FIG. 1 is difference in the thickness of the dielectric layer (for example, the thickness of the first dielectric layer is greater than the thickness of the second or third dielectric layer). A manufacturing method of the redistribution layer structure RD of the disclosure is described below with reference to FIG. 2.

First, the substrate 100 is provided. In the embodiment, the substrate 100 is, for example, a glass substrate, but not limited thereto. In some embodiment, the substrate 100 may include a wafer or include at least one electronic component and an encapsulation material. A thickness of the substrate 100 is, for example, 500 μm to 1500 μm, but not limited thereto.

Next, before disposing the first metal layer M1, the debonding layer 120 may be selectively disposed on the substrate 100. Then, the first metal layer M1 is disposed on the debonding layer 120. A thickness of the debonding layer 120 is 0.5 μm to 1.5 μm, but not limited thereto. A material of the debonding layer 120 includes a photo-curable release film or a thermally cured release film, but not limited thereto. For example, the material of the debonding layer 120 may include polyethylene (PE), polyethylene terephthalate (PET), oriented polypropylene (OPP) or other suitable materials, or a combination of the above-mentioned materials, but not limited thereto. The debonding layer 120 may be decomposed through an illumination system or a heating system. For example, in the case of a photodissociation system, the debonding layer 120 may be irradiated by a laser beam or an ultraviolet beam, so that the debonding layer 120 absorbs energy of the beam to generate a dissociation reaction. In this way, the debonding layer 120 may be easily separated from the first metal layer M1. For a thermal dissociation system, the debonding layer 120 may be heated by a heat source, so that the debonding layer 120 absorbs energy of the heat source to generate a dissociation reaction. In this way, the debonding layer 120 and the substrate 100 may be easily separated from the first metal layer M1. Other dissociation systems may also be used, and are not limited by the disclosure. It should be noted that in some embodiments, the removal of the debonding layer 120 and the substrate 100 is not necessary. That is, according to some embodiments, the debonding layer 120 and the substrate 100 are remained as a part of the package structure. In some other embodiments, the debonding layer 120 and the substrate 100 are removed and are not included in the package structure.

Next, a first redistribution layer RL1' is disposed on the debonding layer 120. The step of disposing the first redistribution layer RL1' includes forming a first metal layer M1 on the debonding layer 120 on the substrate 100. In the embodiment, the first metal layer M1 may be a single-layer metal layer or a stacked-layer structure having multiple stacked sub-metal layers. For example, the first metal layer M1 may include a stack of three sub-metal layers. In detail, a layer of titanium metal layer having a thickness of 0.1 μm to 0.3 μm may be disposed on the debonding layer 120 first. Next, a thin copper metal layer having a thickness of 0.2 μm to 0.5 μm is disposed on the titanium metal layer. Then, a thick copper metal layer having a thickness of 4 μm to 12 μm is disposed on the copper metal layer. The method for forming the first metal layer M1 may include processes such as sputtering, evaporation, physical vapor deposition (PVD), chemical vapor deposition (CVD), or electroplating, but not limited thereto. Under the above configuration, the first metal layer M1 may be, for example, a stacked structure of titanium-copper-copper.

Next, the first dielectric layer IL1' is disposed on the first metal layer M1, so as to form the first redistribution layer RL1. A material of the first dielectric layer IL1' includes photosensitive polyimide, photosensitive polybenzoxazole (photosensitive PB0), benzocyclobutene (BCB), polyaromatic fluorocarbon, photosensitive polyphenylene ether (photosensitive PPE), or other suitable materials, but not limited thereto. A formation method of the first dielectric layer IL1' includes chemical vapor deposition, physical vapor deposition, atomic layer deposition (ALD), spin coating or screen printing, or other suitable methods. In some embodiments, a thickness of the first dielectric layer IL1' is, for example, 11 μm to 19 μm, but not limited thereto. In some embodiments, the thickness of the first dielectric layer IL1' may be 5 μm to 20 μm.

Next, the second redistribution layer RL2' is disposed on the first redistribution layer RL1'. Before the step of disposing the second redistribution layer RL2', multiple conductive vias can be selectively provided in the first dielectric layer IL1'.

The step of disposing the second redistribution layer RL2' includes forming a second metal layer M2 on the first dielectric layer IL1'. The second metal layer M2 may be electrically connected to the first metal layer M1 through the conductive vias of the first dielectric layer IL1', but not limited thereto. In the embodiment, the second metal layer M2 may be a single-layer metal layer or a stacked-layer structure having multiple sub-metal layers. For example, the second metal layer M2 may be, for example, a stacked structure including titanium-copper-copper. The formation method of the second metal layer M2 may be similar to the manufacturing method of the first metal layer M1, and is not repeated herein.

Next, a second dielectric layer IL2' is disposed on the second metal layer M2, so as to form a second redistribution layer RL2'. A material and a manufacturing method of the second dielectric layer IL2' may be similar to those of the first dielectric layer IL1', and is not repeated herein. In some embodiments, a thickness of the second dielectric layer IL2' is, for example, 9 μm to 11 μm, but not limited thereto.

It is worth noting that, in the redistribution layer structure RD' of the disclosure, the coefficient of thermal expansion of the first dielectric layer IL1' is less than the coefficient of thermal expansion of the second dielectric layer IL2'. Therefore, the coefficient of thermal expansion of the first dielectric layer IL1' may be closer to the coefficient of thermal expansion of substrate 100. Thereby, the deformation difference caused by the rising and falling temperatures during the manufacturing process may be reduced. In this way, the redistribution layer structure RD' can reduce the probability of warpage occurring. The redistribution layer structure RD' can have good structural strength or quality. In addition, the thickness of the first dielectric layer IL1' may be greater than the thickness of the second dielectric layer IL2', so the deformation difference between the first dielectric layer IL1' and the second dielectric layer IL2' can be reduced. Alternatively, the stress difference between the first dielectric layer IL1' and the second dielectric layer IL2' may be adjusted, so the impact of the residual stress can be reduced. The structural reliability of the redistribution layer structure RD' can be improved. In addition, in terms of the manufacturing process, the redistribution layer structure RD' can achieve a good manufacturing process yield or quality.

Next, a third redistribution layer RL3' is disposed on the second redistribution layer RL2'. Before the step of disposing the third redistribution layer RL3', multiple conductive vias may be selectively disposed in the second dielectric layer IL2'.

The step of disposing the third redistribution layer RL3' includes forming a third metal layer M3 on the second dielectric layer IL2'. The third metal layer M3 may be electrically connected to the second metal layer M2 through the conductive vias of the second dielectric layer IL2', but not limited thereto. In the embodiment, the third metal layer M3 can be a single-layer metal layer or a stacked-layer structure with multiple stacked sub-metal layers. The formation method of the third metal layer M3 can be similar to the formation method of the first metal layer M1, and will is not repeated herein.

Next, a third dielectric layer IL3' is disposed on the third metal layer M3, so as to form a third redistribution layer RL3'. The material of the third dielectric layer IL3' is similar to that of the second dielectric layer IL2', and the method of forming the third dielectric layer IL3' is similar to the method of forming the second dielectric layer IL2', therefore it is not repeated herein. In some embodiments, a thickness of the third dielectric layer IL3' may be, for example, 7 μm to 9 μm, but not limited thereto.

Next, the fourth redistribution layer RL4' is disposed on the third redistribution layer RL3'. Before the step of disposing the fourth redistribution layer RL4', multiple conductive vias may be selectively disposed in the third dielectric layer IL3'. The conductive vias may be electrically connected to the third metal layer M3.

The step of disposing the fourth redistribution layer RL4' includes forming a fourth metal layer M4 on the third dielectric layer IL3'. The fourth metal layer M4 may be electrically connected to the third metal layer M3 through the conductive vias of the third dielectric layer IL2', but not limited thereto. In the embodiment, the fourth metal layer M4 may be a single-layer metal layer or a stacked-layer structure with multiple stacked sub-metal layers. For example, the fourth metal layer M4 may include a stack of three sub-metal layers, and the formation method thereof may be similar to that of the first metal layer M1. Thus, it is not repeated herein.

Next, a fourth dielectric layer IL4' is provided on the fourth metal layer M4, so as to form the fourth redistribution layer RL4'. A material of the fourth dielectric layer IL4' is similar to that of the second dielectric layer IL2', and a method of forming the fourth dielectric layer IL4' is similar to the method of forming the second dielectric layer IL2', so it is not repeated herein. In some embodiments, a thickness of the fourth dielectric layer IL4' is, for example, 5 μm to 9 μm, but not limited thereto.

Under the above configuration, the thickness of the first dielectric layer IL1' may be larger than the respective thickness of the other dielectric layers IL2', IL3', and IL4'. In some embodiments, the coefficients of thermal expansion of the multiple dielectric layers in the redistribution layer structure RD' may be respectively arranged to gradually increase in a gradient from the bottom to the top. Or the thickness of the multiple dielectric layers in the redistribution layer structure RD' may be arranged to gradually reduce in a gradient from the bottom to the top. In this way, the deformation difference between different dielectric layers may be reduced. The impact of the residual stress may be reduced. In addition, in terms of the manufacturing process, the redistribution layer structure RD' may achieve a good manufacturing process yield or quality. In addition, the upper dielectric layer, which is subjected to repeated heating and cooling manufacturing processes several times less, can use a dielectric material with a higher coefficient of thermal expansion to control the manufacturing cost.

Then, before the step of removing the substrate 100, the top connector 140 may be disposed on the fourth dielectric layer IL4'. In some embodiments, the fourth dielectric layer IL4' may include openings (not shown). The top connector 140 may be electrically connected to the fourth metal layer M4 through the openings. The top connector 140 is, for example, a single-layer metal layer or a stacked-layer structure with multiple stacked sub-metal layers. For example, the top connector 140 may be a single-layered copper layer, or a multi-layered titanium-copper structure, but not limited thereto.

Then, the electronic component 160 (e.g., a chip) is disposed on the fourth dielectric layer IL4' or on the top connector 140. The electronic component 160 can be electrically connected to the fourth metal layer M4 through connecting to the top connector 140, but not limited thereto.

Then, an encapsulation material layer (not shown) is disposed on the fourth dielectric layer IL4' or on the top connector 140. The encapsulation material layer may encapsulate the electronic component 160 to embed the electronic component 160 in the encapsulation material layer. A material of the encapsulation material layer is, for example, epoxy, or other suitable materials, and not limited thereto.

Next, the substrate 100 is removed. Specifically, the debonding layer 120 may absorb energy to generate a dissociation reaction through an illumination system or a heating system, etc., so that the substrate 100 and the redistribution layer structure RD' may be separated. In some embodiments, the step of disposing the top connector 140, the step of disposing the electronic component 160, or the step of disposing the encapsulation material layer may also be performed after the step of removing the substrate 100, which is not limited by the embodiment of the disclosure.

As mentioned above, the RDL-first manufacturing method is exemplarily used in the present disclosure. The method of manufacturing the redistribution layer structures RD or RD' of the disclosure may be also applied to a chip-first manufacturing method. In the chip-first manufacturing method, a chip molding process is performed to make a substrate 100 including at least one chip and a molding material, and then the redistribution layer is formed on the substrate 100.

The chip-first manufacturing method may be further divided into a chip-first/face-up manufacturing method and a chip-first/face-down manufacturing method. The main difference between the chip-first/face-up manufacturing method and the chip-first/face-down manufacturing method is the original locations of the pins of a chip (not shown) when the chip molding process is finished. The pins are used to electrically connect the redistribution layer structures RD or RD'.

In summary, in the redistribution layer structure according to an embodiment of the disclosure, the coefficient of thermal expansion of the first dielectric layer is less than the coefficient of thermal expansion of the second dielectric layer. In this way, the first dielectric layer having a lower coefficient of thermal expansion can be matched with the substrate having a lower coefficient of thermal expansion. The deformation difference caused by the rising and falling temperatures during the manufacturing process may be reduced. Therefore, the probability of warpage occurring in the redistribution layer structure may be reduced. The redistribution layer structure may have a good structural strength or quality. In addition, the coefficients of thermal expansion of the respective multiple dielectric layers in the redistribution layer structure can be arranged to gradually increase in a gradient from the bottom to the top. The thickness of the respective multiple dielectric layers in the redistribution layer structure can be gradually reduced in a gradient from the bottom to the top. Therefore, the deformation difference between different dielectric layers can be reduced. The impact of the residual stress can be reduced. In addition, in terms of the manufacturing process, the redistribution layer structure can achieve good manufacturing process yield or quality. In addition, the upper dielectric layer, which is subjected to lesser amount of repeated heating and cooling manufacturing processes, can be composed of a dielectric material with a higher coefficient of thermal expansion, so as to limit the manufacturing cost.

Finally, it should be noted that the foregoing embodiments are only used to illustrate the technical solutions of the disclosure, and not intended to limit the disclosure. Although the disclosure has been described in detail with reference to the foregoing embodiments, persons skilled in the art should understand that modifications to the technical solutions described in the foregoing embodiments or equivalent replacements may be made to some or all of the technical features. However, the modifications or replacements do not cause the essence of the corresponding technical solutions to depart from the scope of the technical solutions according to the embodiments of the disclosure.

What is claimed is:

1. A package structure, comprising:
   a glass substrate;
   a redistribution layer structure disposed on the glass substrate; and
   an electronic component disposed on the redistribution layer structure,
   wherein the redistribution layer structure comprising:
     a first metal layer disposed on the glass substrate;
     a first dielectric layer disposed on the first metal layer;
     a second metal layer disposed on the first dielectric layer;
     a second dielectric layer disposed on the second metal layer;
     a third metal layer disposed on the second dielectric layer;
     a third dielectric layer disposed on the third metal layer;
     a fourth metal layer disposed on the third dielectric layer; and
     a fourth dielectric layer disposed on the fourth metal layer,
   wherein, a coefficient of thermal expansion of the first dielectric layer is less than a coefficient of thermal expansion of the second dielectric layer, the coefficient of thermal expansion of the second dielectric layer is less than a coefficient of thermal expansion of the third dielectric layer, and the coefficient of thermal expansion of the third dielectric layer is less than a coefficient of thermal expansion of the fourth dielectric layer,
   wherein a thickness of the first dielectric layer is greater than a thickness of the second dielectric layer, and the thickness of the second dielectric layer is greater than a thickness of the third dielectric layer.

2. The package structure according to claim 1, wherein the thickness of the first dielectric layer is 11 µm to 19 µm.

3. The package structure of claim 1, wherein a Young's modulus of the first dielectric layer is 3 GPa to 5 GPa.

4. The package structure of claim 1, wherein the coefficient of thermal expansion of the first dielectric layer is 20 ppm/° C. to 40 ppm/° C.

5. The package structure according to claim 1, wherein the thickness of the second dielectric layer is 9 µm to 11 µm.

6. The package structure according to claim 1, wherein a thickness of the first metal layer is 4 µm to 13 µm.

7. The package structure of claim 1, wherein a Young's modulus of the first metal layer is 90 GPa to 120 GPa.

8. The package structure of claim 1, wherein a coefficient of thermal expansion of the first metal layer is 16 ppm/° C. to 20 ppm/° C.

9. The package structure according to claim 1, further comprising:
   a top connector disposed on the fourth dielectric layer, and the top connector is electrically connected to the fourth metal layer.

10. The package structure according to claim 1, wherein the glass substrate comprises an electronic component and an encapsulation material.

11. The package structure according to claim 1, further comprising a debonding layer disposed between the glass substrate and the redistribution layer structure.

\* \* \* \* \*